United States Patent [19]
Moody et al.

[11] Patent Number: 5,231,357
[45] Date of Patent: Jul. 27, 1993

[54] APPARATUS FOR TESTING A WIRE HARNESS AND METHOD OF USE

[75] Inventors: Roy A. Moody, Flossmoor; William C. Kearns, Lemont; Robert F. Levin, Braceville; Thomas C. Pienkowski; David W. West, both of Naperville, all of Ill.

[73] Assignee: Panduit Corp., Tinley Park, Ill.

[21] Appl. No.: 521,623

[22] Filed: May 9, 1990

[51] Int. Cl.$^5$ .................................. G01R 31/04
[52] U.S. Cl. ........................ 324/539; 324/538; 29/593
[58] Field of Search ................ 324/538–542; 29/593

[56] References Cited

U.S. PATENT DOCUMENTS

| | | | |
|---|---|---|---|
| 2,643,285 | 6/1953 | Cranford | 175/183 |
| 3,694,736 | 9/1972 | Wakefield | 324/51 |
| 3,803,484 | 4/1974 | Gray | 324/538 X |
| 4,055,889 | 11/1977 | Fusco et al. | |
| 4,285,118 | 8/1981 | Peppler et al. | 29/593 |
| 4,409,541 | 10/1983 | Richards | 324/51 |
| 4,418,250 | 11/1983 | Hilligoss | 324/540 X |
| 4,554,733 | 11/1985 | Caveney | 29/749 |
| 4,579,414 | 4/1986 | Caveney et al. | 339/99 R |
| 4,596,072 | 6/1986 | Shields . | |
| 4,654,580 | 3/1987 | Keller | 324/51 |
| 4,689,551 | 8/1987 | Ryan et al. | 324/539 |
| 4,695,788 | 9/1987 | Marshall | 324/527 |
| 4,734,651 | 3/1988 | Keller et al. | 324/538 |
| 4,902,968 | 2/1990 | Sugimoto | 324/538 X |

FOREIGN PATENT DOCUMENTS

2179751 3/1987 United Kingdom .

Primary Examiner—Jack B. Harvey
Attorney, Agent, or Firm—Charles R. Wentzel; Mark D. Hilliard

[57] ABSTRACT

An automatic harness testing apparatus test a multiconductor single connector wire harness for continuity faults in each conductive path of the wire harness by capacitively inducing an oscillatory test signal through the insulation of the conductors, probing each of the terminals of the connector and sequentially testing each probe for the presence of a test signal having a predetermined amplitude.

37 Claims, 10 Drawing Sheets

APPARATUS FOR TESTING A WIRE HARNESS AND METHOD OF USE

TECHNICAL FIELD

The present invention relates generally to an apparatus for testing wiring harnesses for electrical faults and specifically relates to an apparatus adapted to terminate a single connector to a conductor or conductors to form a wire harness and to concurrently test the single-connector wire harness for electrical faults, such as open circuits caused by wire or wire-to-terminal discontinuities and short circuits between adjacent conductors or terminals.

BACKGROUND ART

One apparatus has been proposed to test a single-connector harness by supplying substantially identical oscillatory signals to the arms of a two-arm bridge circuit, the arms of which are connected to respective inlets of a different amplifier, the arms being grounded through capacitances and a ground plane existing in the vicinity of the lead. Continuity between an electrically connected terminal and wire core unbalances the signal inputs supplied by the bridge circuit to the differential amplifier to emit a continuity test signal. Reference may be made to U.S. Pat. Nos. 4,654,580 and 4,734,651.

The testing apparatus proposed in the above patents inherently is subject to error due to imbalances induced in the bridge circuit by changes in temperature of the proposed apparatus in the work environment, thus means must be provided to balance the bridge circuit prior to each continuity test. In addition, the use of the machine and operator as a natural ground plane may also introduce other variables that may unintentionally unbalance the bridge circuit and provide a false indication of continuity.

In order to test a wire harness the terminal test probes utilized in the apparatus of the above patents are laterally inserted into special windows in a connector wall to engage the terminals of the connector. Thus, the propose apparatus does not disclose an apparatus capable of concurrently terminating and testing connectors not having lateral access windows formed in a manner allowing accurate engagement of the connector terminals by the test probes. In addition, the probes of this apparatus do not engage the contact portion of the connector terminals and thus the apparatus does not test the mechanical and electrical integrity of the contact portion of the connector terminal in a manner simulating actual mating engagement between the contact portions and a male connector.

DISCLOSURE OF THE INVENTION

It is an object of the present invention to provide an apparatus that can accurately test a connector harness for an open circuit fault while only conductively engaging a terminal of a single connector.

It is an additional object of the present invention to provide an apparatus that can terminate a connector to a conductor or conductors to form a single-connector wire harness and concurrently probe each terminal of the connector to test the single-connector wire harness for open circuits.

In general, an apparatus for testing a wire harness having at least one connector conductively connected by a terminal to a conductor of an insulated wire to form a conductive path includes connector probe means for conductively engaging and connecting a terminal of a conductive path to be tested to a connector outlet, test signal means for capacitively inducing an oscillatory signal in the conductor of a wire of the conductive path to be tested, and electrical continuity test means for measuring the amplitude of the oscillatory signal at the connector outlet of each conductive path to be tested and comparing the measured amplitude to a pre-determined amplitude value and for providing a fault signal indicative of the condition of the conductive path to be tested when the measured amplitude is equal to the predetermined amplitude value.

DESCRIPTION OF THE PREFERRED EMBODIMENTS

An automatic harness testing apparatus embodying the concept of the present invention is designated generally by a numeral 20 in the accompanying drawings.

Apparatus 20 is specifically adapted to concurrently terminate connector 21 to a multiconductor flat cable 22 to form a single-connector wire harness and to test the completed harness for electrical faults such as open circuits caused by wire discontinuities or by missing or damaged connector terminals, or short circuits between adjacent conductors or adjacent connector terminals. See U.S. Pat. No. 4,579,414 to Caveney et al. owned by our common assignee, which is incorporated herein by reference, for a detailed description of a connector of the same type as connector 21.

Figure 5:
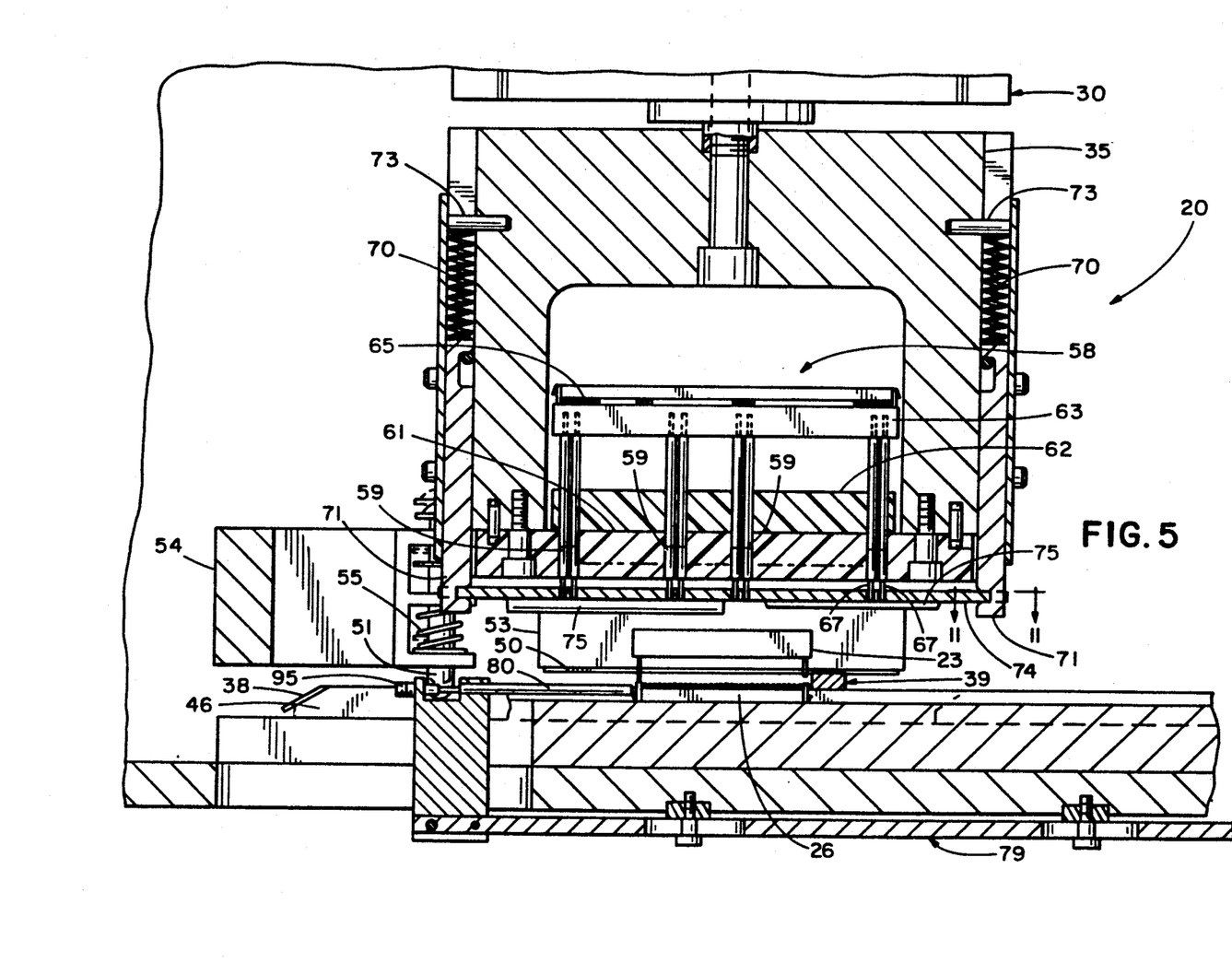
FIG. 5 is a sectional view taken along line 5—5 of FIG. 2.

Connector 21, as best seen in FIGS. 5 includes an insulative base 23 which mounts a plurality of insulation displacement terminals 24 having contact portions 25 that mate with the pins of a male connector, an insulative cover 26 and a metallic clip 27 which connects base 23 to cover 26 at one end. Connector 21 allows lateral entry of multiconductor cable 22 which is electrically terminated to connector 21 by compression of base 23 towards cover 26 to terminate and secure cable 22 therebetween.

Figure 8:
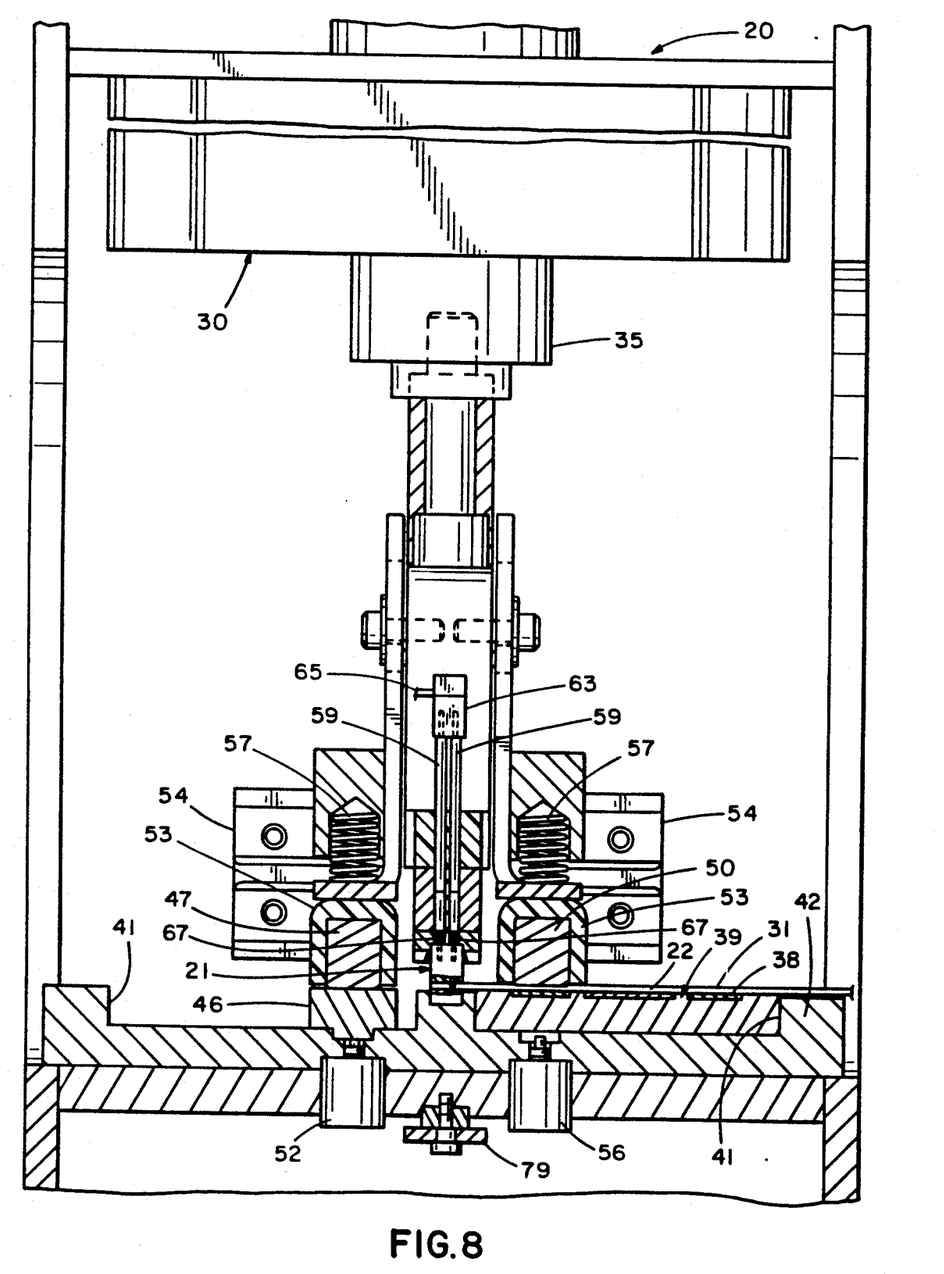
FIG. 8 is a fragmentary partial sectional view taken along line 8—8 of FIG. 7.

In preferred form apparatus 20 includes press 30 for terminating connector 21 to cable 22 to form a harness 31, as seen in FIG. 8, and means for concurrently electrically testing the newly formed harness 31 before removal of the harness from the press 30. The electrical circuitry utilized in apparatus 20 is described in FIG. 12 in combination with an alternative harness test fixture 34 substituted for apparatus 20. Test fixture 34 performs identical electrical fault tests as apparatus 20 for previously terminated single-connector cable harnesses.

Figure 1:
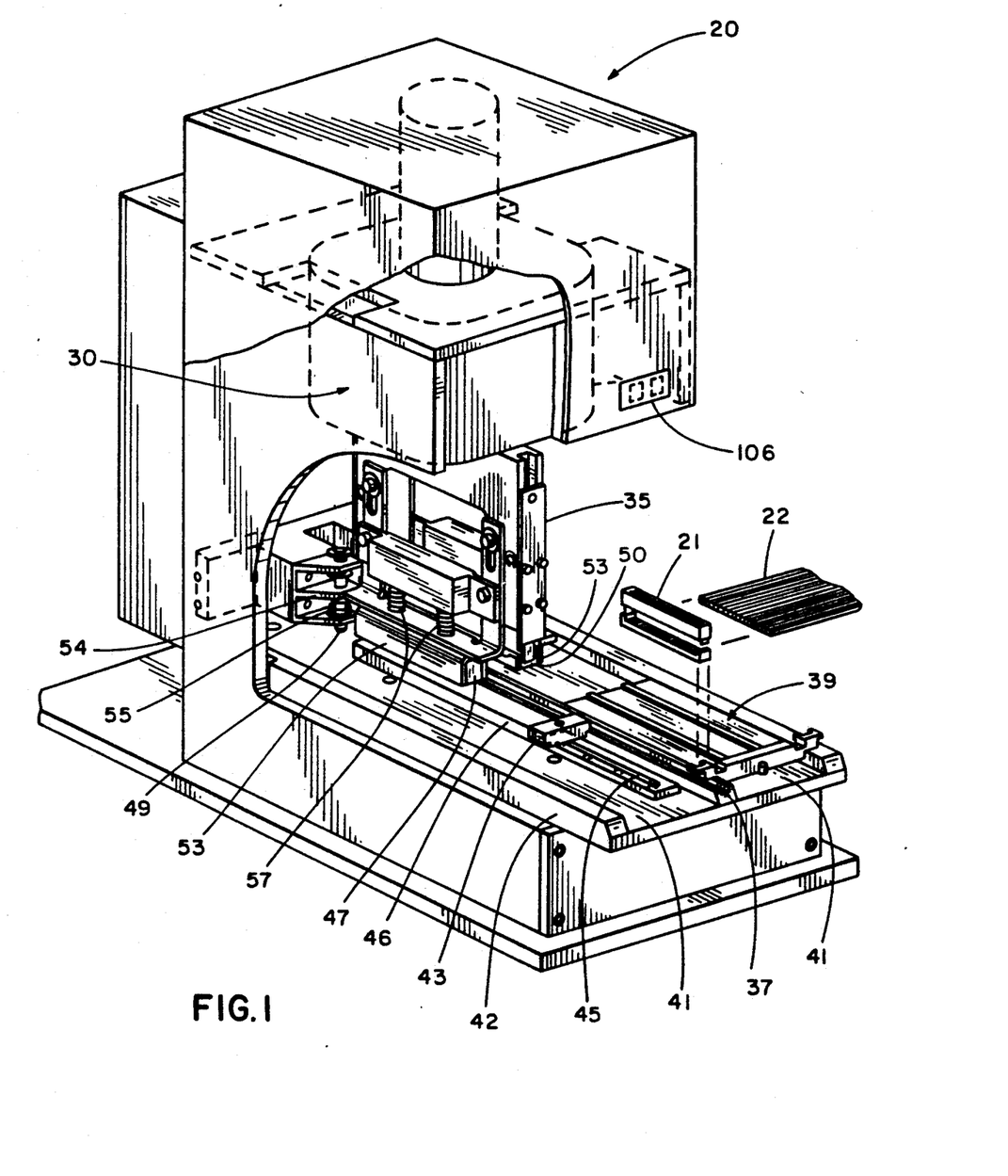
FIG. 1 is an isometric view of an automatic harness testing apparatus embodying the concept of the present invention.
Figure 2:
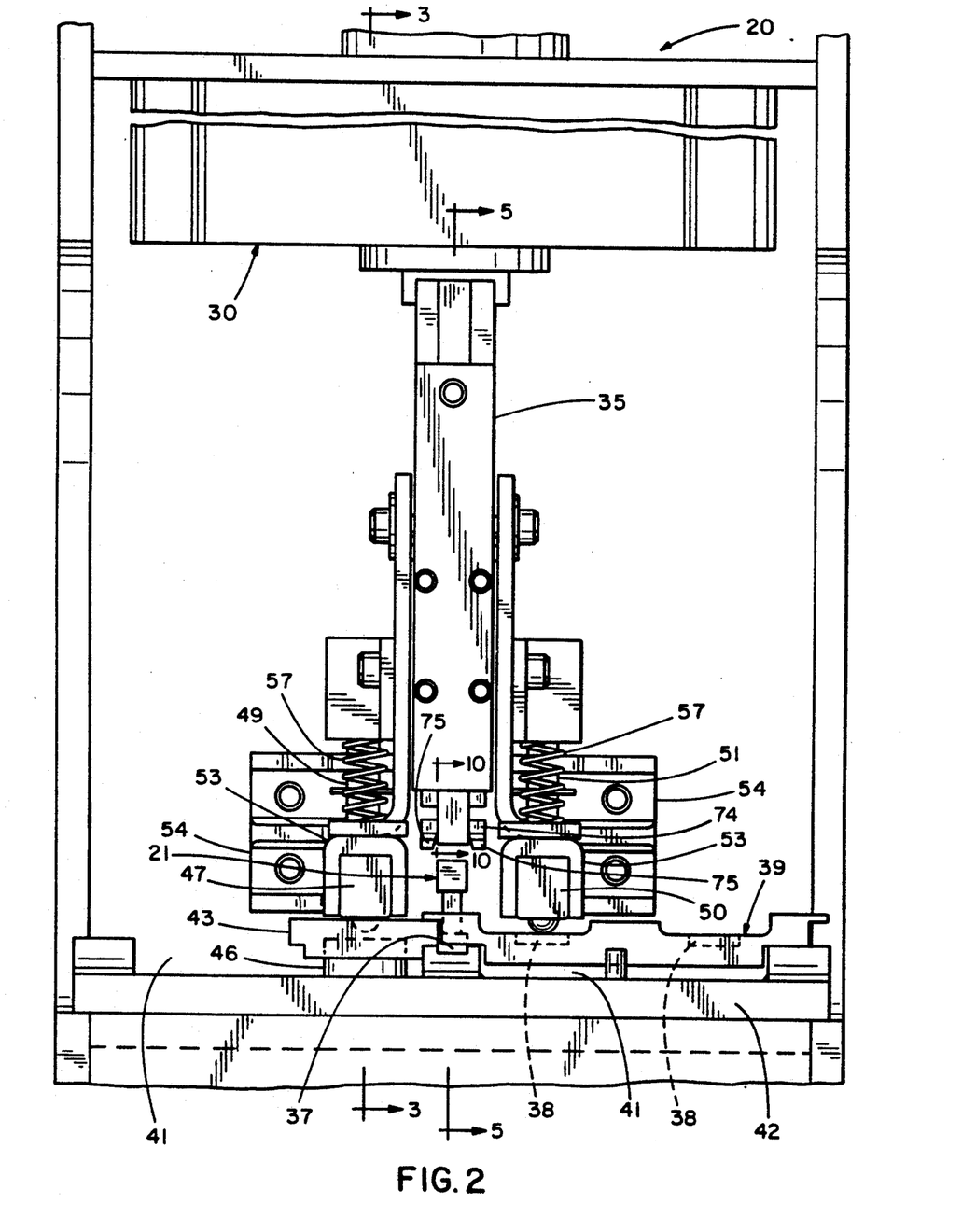
FIG. 2 is a front view of the apparatus of FIG. 1.
Figure 3:
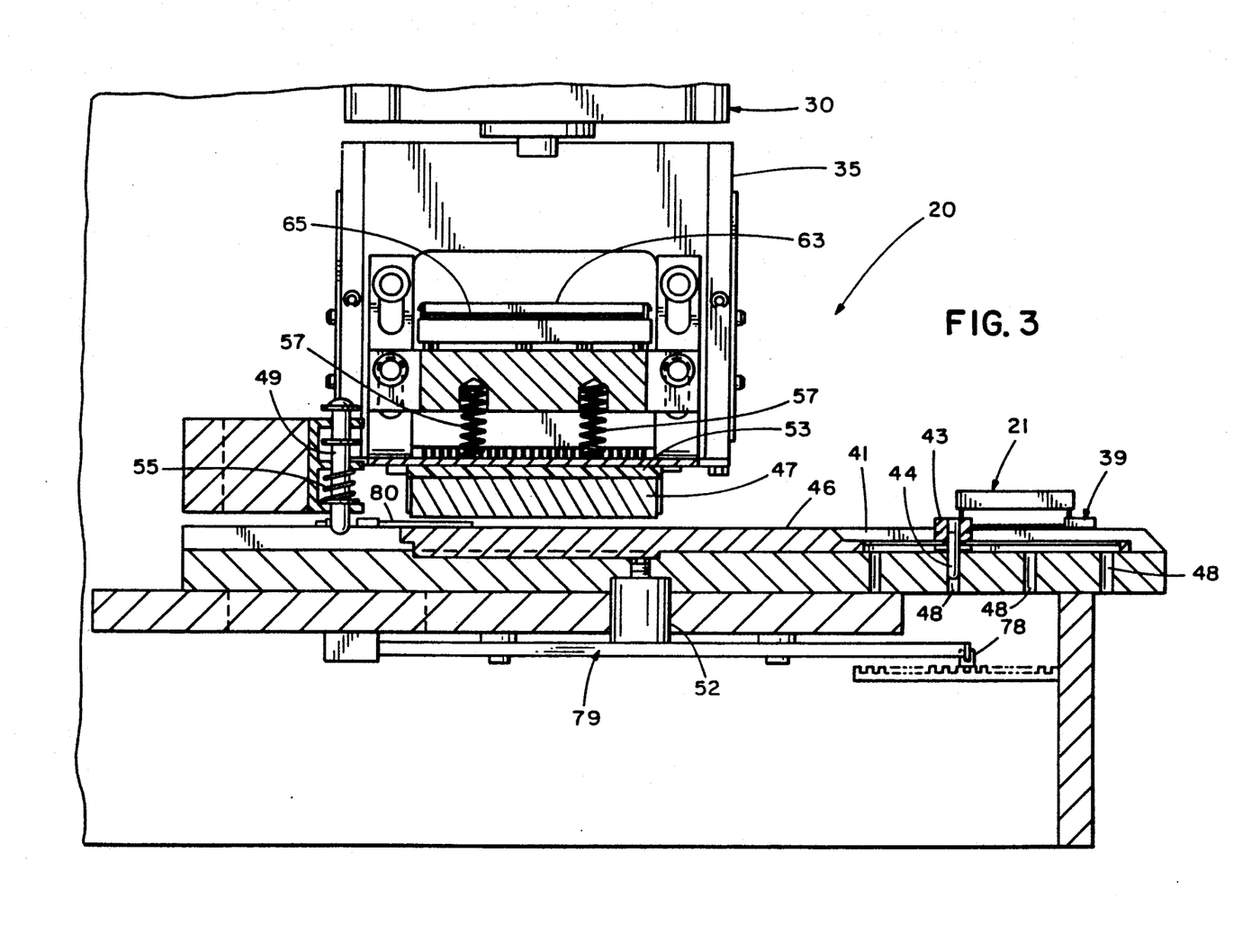
FIG. 3 is a sectional view taken along line 3—3 of FIG. 2.

As seen in FIG. 2, press 30 includes a conventional prime mover press mechanism that reciprocates a ram 35 toward and away from a connector positioning channel 37 with sufficient force to terminate connector 21 to cable 22. Cable positioning tray 39 can be slidably mounted in either of two tray positioning channels 41 formed on base 42 of press 30 allowing either left- or right-hand operation of press 30. A cable stop 43 is slidably mounted in slot 45 of cable support bar 46, see FIG. 1. Cable stop 43 correctly positions cable 22 when it is initially aligned with connector 21 on tray 39. Cable support bar 46 is releasably mounted in base 42 by insertion of a mounting pin 44 in bar mounting apertures 48 in base 42, as seen in FIG. 3. A press utilizing a similar cable tray arrangement is described in detail in U.S. Pat. No. 4,554,733, assigned to our common assignee, which is incorporated herein by reference.

Figure 4:
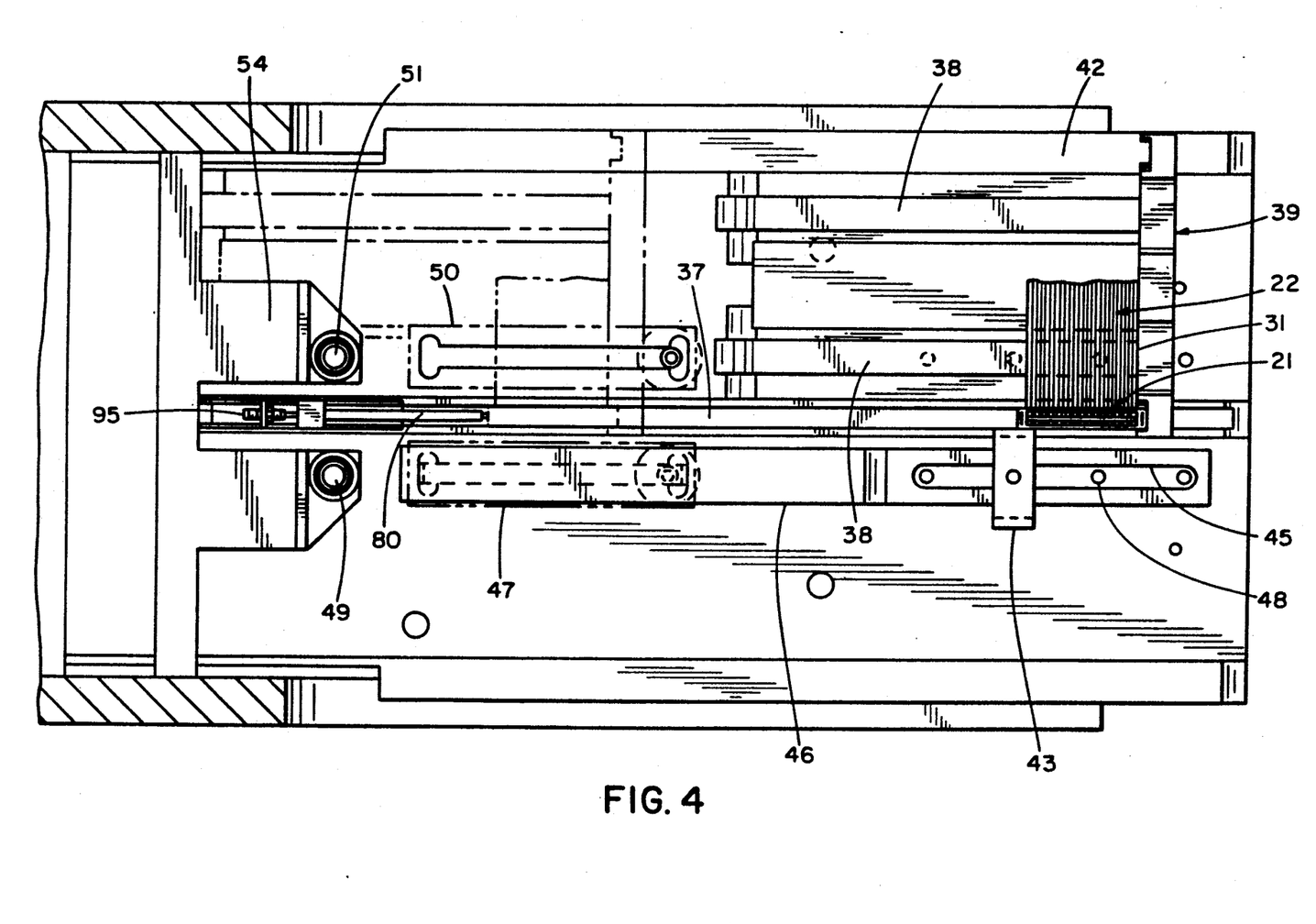
FIG. 4 is a plan of the apparatus of FIG. 1 with the ram removed and the press frame sectioned to view the operational positions of the harness tray with the innermost position being drawn in phantom.

As best seen in FIGS. 1 and 2, signal injection means includes left signal emitting bar 47 and left signal contact 49 or right signal emitting bar 50 and right signal contact 51. Conductive bars 47 and 50 are formed of solid brass and are each insulated by respective plastic sheaths 53. Contacts 49 and 51 are insulated by a plastic bracket 54. A test signal is applied only to left bar 47 and contact 49 or to right bar 50 and contact 51 depending upon the position of cable tray 39 in either the left or right tray positioning channel 41. The position of cable support bar 46 is sensed by either of two switches 52 or 56, shown in FIG. 8, providing a signal to the circuitry of apparatus 20 allowing selection of the left or right bar and contact pair for the application of the test signal. Bars 47 and 50 and contacts 49 and 51 are metallic electrodes insulated from ground and conductively connected to the circuitry of apparatus 20 for receipt of a test signal. Contacts 49 and 51 are resiliently mounted by springs 55 to the frame of press 30 in a position to conductively engage either of two copper signal emitting strips 38 inset in the surface of non-conductive plastic cable tray 39 when tray 39 is in a termination position underneath ram 35. See FIGS. 4 and 5, the phantom lines of FIG. 4 illustrating the termination position of tray 39. Each strip 38 of tray 39 conducts the test signal applied to it by each respective contact and emits the signal to the bottom surface of an insulated cable 22 positioned on tray 39.

Signal emitting bars 47 and 50 are resiliently mounted on ram 35 by springs 57. See FIGS. 1-3. Each bar 47 or 50 is positioned to resiliently engage cable 22 when disposed on cable positioning tray 39 in the termination position to apply a signal to the top surface of cable 22 identical to the signal applied by strips 38 of cable tray 39. Cable support bar 46 is disposed underneath and in alignment with the signal emitting bar not positioned over cable tray 39 such that a cable extending through connector 21 during the termination of a "daisy-chain" type harness is supported at the same height as the portion of cable positioned in connector 21, thus preventing any undesirable deformation of cable 22.

As best seen in FIGS. 5-9, a terminal probe mechanism 58 is mounted on ram 35 and presents a plurality of connector terminal probes 59 mounted in apertures in non-conductive ram plates 61 and 62. Probes 59 are disposed to enter apertures containing contact portions 25 of terminals 24 of a connector immediately after termination of connector 21 to cable 22 and conductively engage each contact portion 25 of each terminal 24, each probe 59 being conductively isolated from any other probe 59 to provide a conductive path to a single harness conductive path through terminal 24 of connector 21. Probes 59 are disposed to mate with the contact portions 25 of terminals 24 in the same manner as a male connector mates with the terminated connector. Thus, the present invention can test varied connector designs in a manner that duplicates the normal mechanical and electrical action of the connector in actual use.

Figure 12:
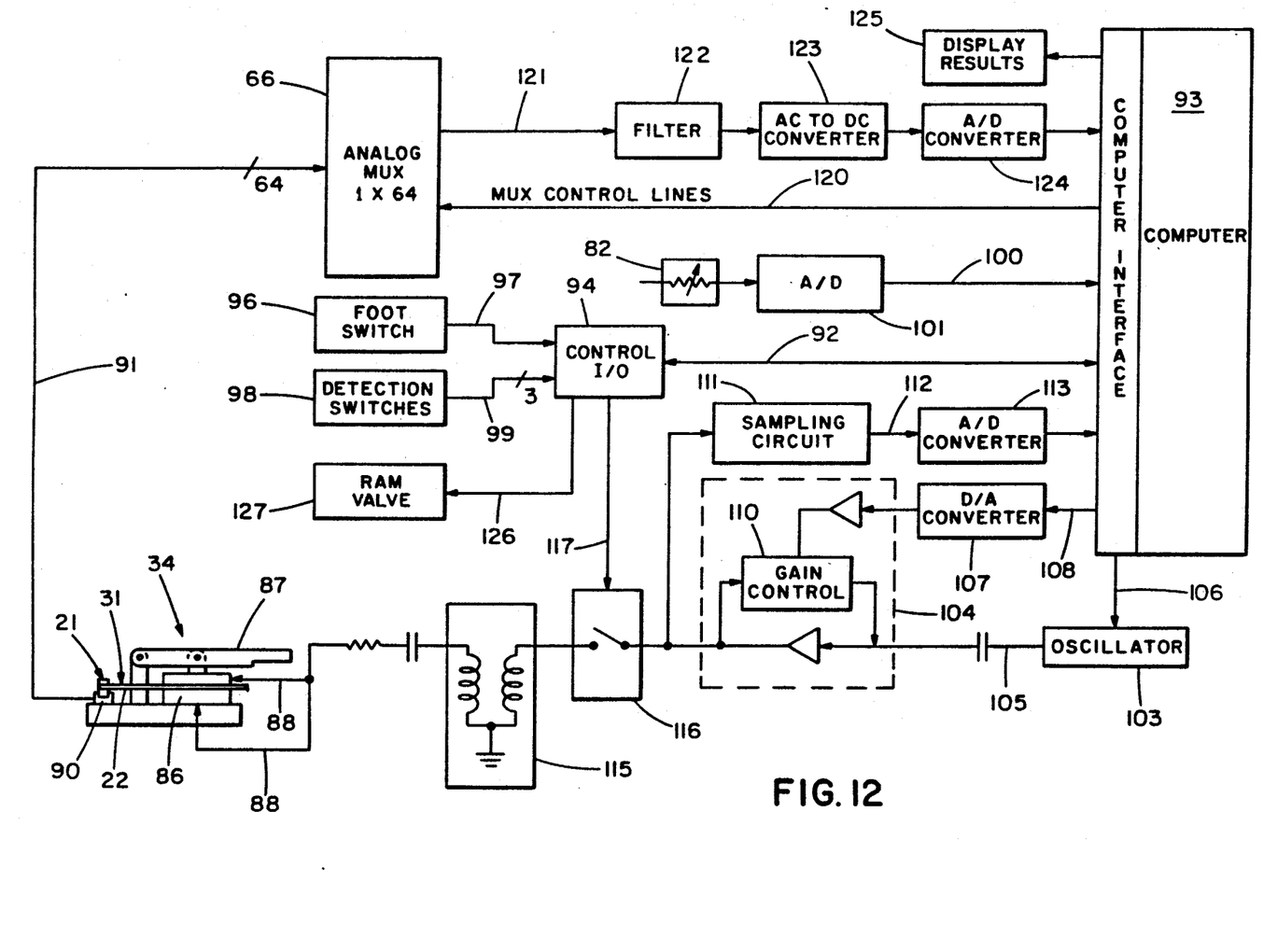
FIG. 12 is a circuit diagram, in block schematic form, of the circuitry of the harness testing means utilized in the apparatus of FIG. 1, shown with an alternative harness testing fixture.

Probes 59 are each connected by a probe connector 63 to a shielded multiconductor cable 65 that in turn is connected to an analog multiplexer 66 shown in FIG. 12. Each probe 59 comprises a cylindrical probe contact 67 resiliently biased outwardly by a spring 69.

Figure 6:
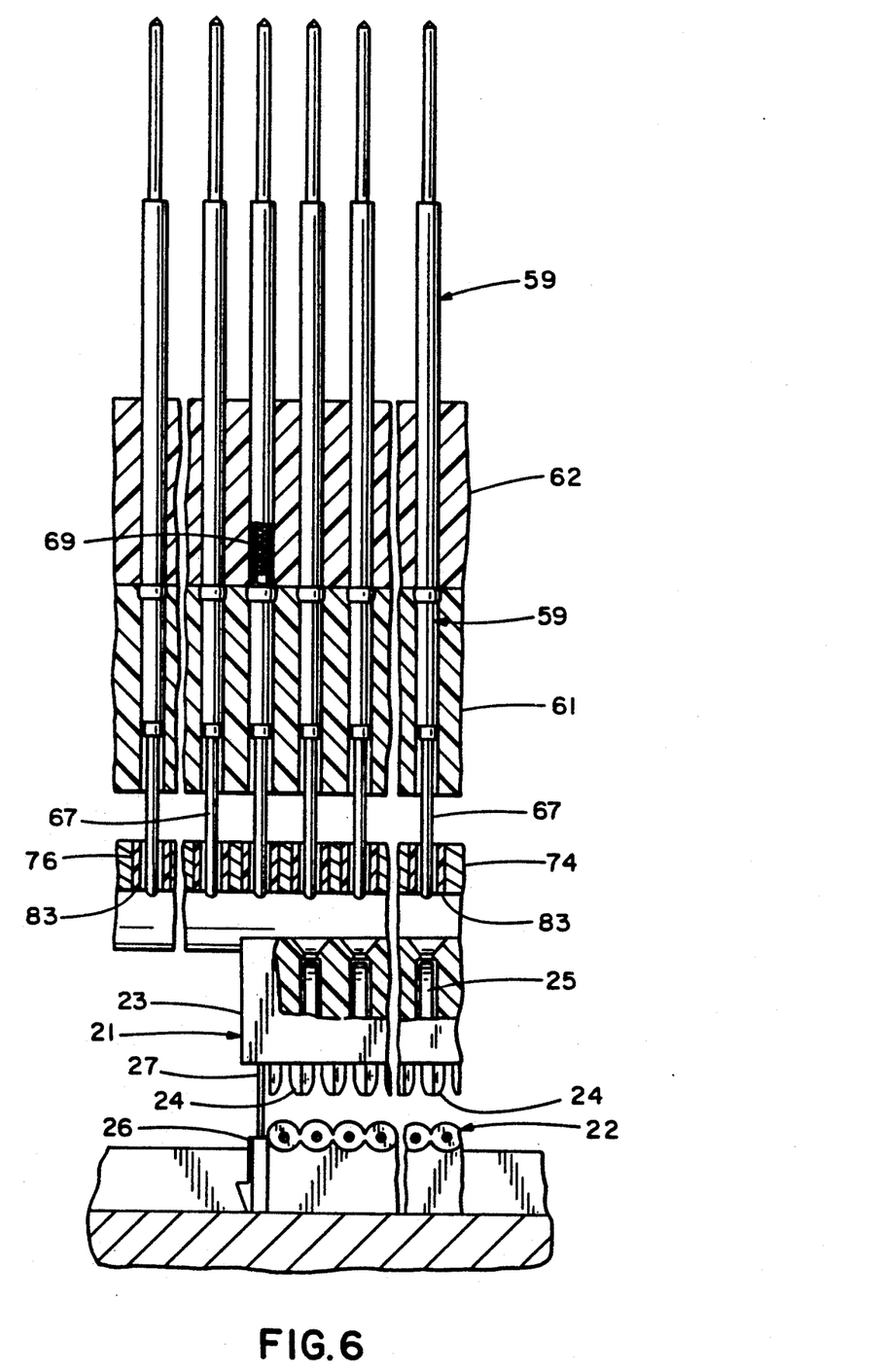
FIG. 6 is a fragmentary sectional view showing the ram mounted terminal probes of the apparatus of FIG. 1.
Figure 7:
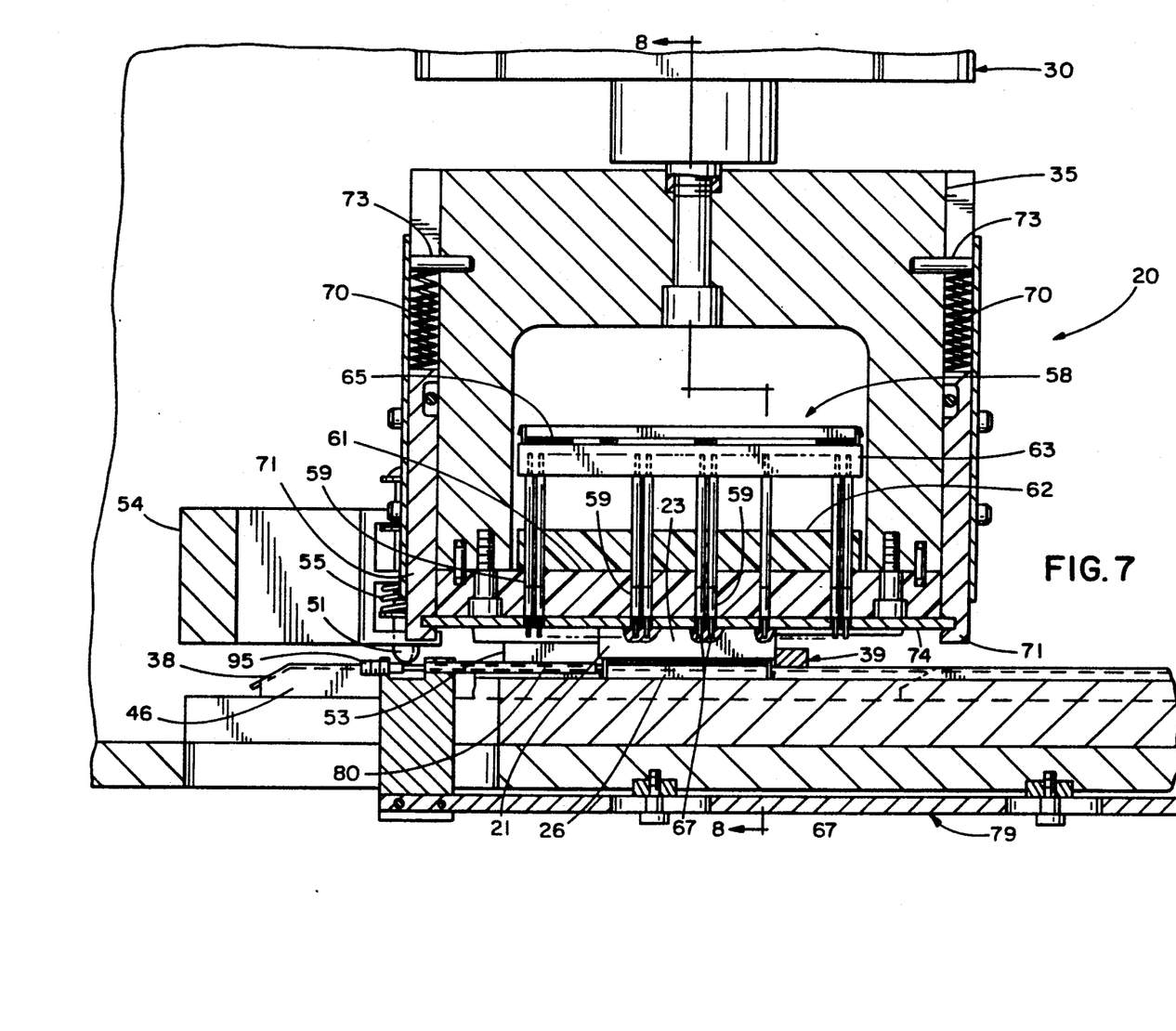
FIG. 7 is the sectional view of FIG. 5 with the ram of the apparatus in the fully extended connector test position of FIG. 1.
Figure 9:
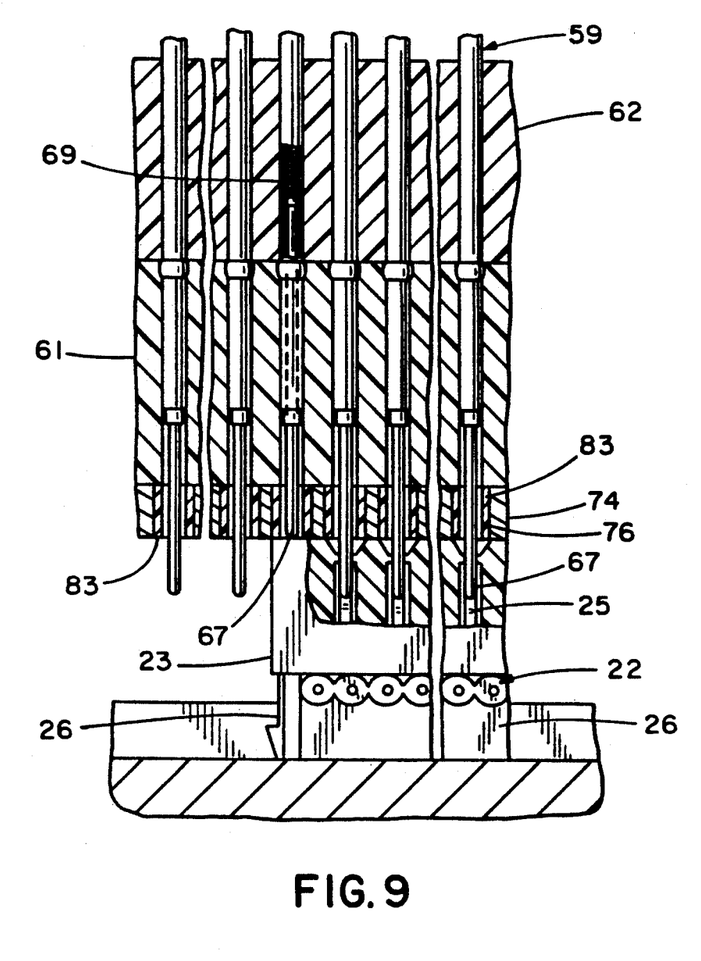
FIG. 9 is a fragmentary section view of the apparatus of FIG. 1 showing the probes positioned within the contacts of a terminated connector.

As best seen in FIGS. 5 and 7, springs 70 resiliently bias arms 71 mounted for reciprocation on ram 35 by roll pins 73. Stripper plate 74 is mounted in slots 72, see FIGS. 10-11, in the distal ends of arms 71. Referring now to FIG. 6, stripper plate 74 includes a plurality of apertures 76 aligned with and corresponding to probes 59. Each aperture 76 includes a molded plastic insert 83 which insulates probe contacts 6 from plate 74. Stripper plate 74 is mounted to project past the distal ends of extended contacts 67 such that as ram 35 descends, stripper plate 74 first engages insulative base 23 of connector 21 and compresses it downwardly to terminate connector 21 to cable 22. As seen in FIG. 2, downwardly projecting tapered flanges 75 are formed along each lower edge of stripper plate 74. Flanges 75 are disposed to engage connector 21 along opposing upper lateral edges and guide connector 21 into accurate alignment with plate 74. Further downward movement of ram 35 compresses stripper plate 74 against springs 70 exposing probe contacts 67 which enter apertures of connector 21 to engage each respective terminal 24. As seen in FIG. 9, the resiliently mounted probe contacts 67 directly opposite outward edges of connector 21, when not aligned with a terminal aperture, are compressed inwardly without harm to the probe 59 or connector 21.

Figure 10:
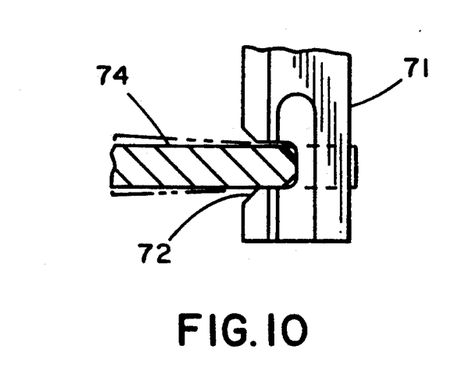
FIG. 10 is a fragmentary sectional view of the mounting features of the stripper plate of the apparatus of FIG. 1.
Figure 11:
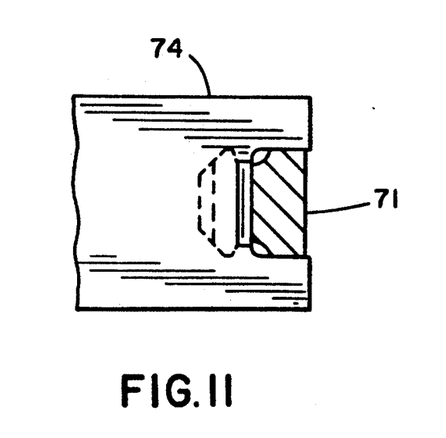
FIG. 11 is a fragmentary sectional top view of the stripper plate mounting features shown in FIG. 10.

After the harness testing is complete, ram 35 is withdrawn and the force in springs 70 drives stripper plate 74 downwardly, removing cylindrical probe contacts 67 from connector 21. As seen in FIGS. 10 and 11, the mounting of stripper plate 74 in slots 72 allows slight upward and downward movement of stripperplate 74 which prevents jamming of cylindrical probe contacts 67 in apertures 76 of stripper plate 74 if connector 21 is not properly centered with respect to ram 35.

As seen in FIG. 9, inserts 83 are formed with an inner diameter greater than the diameter of contacts 67 to provide sufficient clearance to allow limited movement of the contacts which also prevents jamming of contacts 67 in stripper plate 74.

Apparatus 20 includes a connector centering mechanism for automatically centering different length connectors with respect to ram 35, thus ensuring the uniform application of termination force along the length of connector 21. As seen in FIGS. 3-5, the connector centering mechanism includes an operator selectable switch 78 which is connected by a linkage mechanism 79 to a connector positioning rod 80. Positioning rod 80 is positioned in connector positioning channel 37 with its distal end disposed to stop inward movement of a connector carried by cable positioning tray 39. Selection of the connector size to be terminated by proper placement of switch 78 positions rod 80, through linkage mechanism 79, to a position that will correctly stop and align a connector inserted under ram 35 on tray 39 to be centered with respect to ram 35 and probe contacts 67. Also connected to switch 78 is a linear potentiometer which provides a signal to the control circuitry which indicates the size of connector to be tested and thus the proper probes 59 to be tested.

FIG. 12 describes the electrical test circuitry of apparatus 20 used to test multiple conductive paths, each conductive path including a single terminal of connector 21 and a single wire of cable 22 conductively terminated thereto.

Harness test fixture 34 is an alternative embodiment of the harness testing features of apparatus 20 for use as a stand alone test fixture for testing wire harnesses 31 previously manufactured. Harness test fixture 34 includes signal emitting bars 86 which are clamped on either side of cable 22 by lever arm 87. An oscillating test signal is conducted to bars 86 through signal injection lines 88. Connector 21 of harness 31 is mated with a standard header connector 90 mounted on test fixture 34. Connector 90 is terminated to connector outlet line 91 which is a shielded 64 conductor flat cable.

In apparatus 20 signal injection lines 88 are either connected to left signal emitting bar 47 and to signal emitting strip 38 of cable positioning tray 39 through left signal contact 49 or to right signal emitting bar 50 and to signal emitting strip 38 by right signal contact 51 depending on the position of cable support bar 46 which actuates switch 52 or 56 that signals the control circuitry to selectively only apply the test signal to strip 38 and the appropriate bar 47 or 50 of apparatus 20. The control circuitry utilizes a multi-pole relay (not shown) to selectively apply the test signal to the proper signal injection elements on either side of the press. The output of the relay is connected to signal emitting bars 47 and 50 and to signal contacts 49 and 51 by a shielded coaxial cable (not shown in the FIGS. describing apparatus 20), the shield of each cable being connected to earth ground. The selective application of the test signal to only the cable tray side of the press ensures that the test signal is not attenuated by the opposite signal bar if it comes in conductive contact with cable support bar 46. Probe connector 63 of apparatus 20 is connected to connector outlet line 91 which is a 64 conductor shielded flat cable (identified by numeral 65 in FIG. 8).

In preferred form, the electrical test circuitry for apparatus 20 is controlled by a programmable microcomputer 93 programmed to be responsive to various operational inputs through input/output control circuit 94 connected to microcomputer 93 by line 92, see FIG. 12.

Input/output control circuit 94 receives signals from foot switch 96 through line 97 and connector detection switches 98 through line 99. Detection switches include two switches positioned in left and right tray positioning channels disposed to sense the position of cable support bar 46 and a connector detection switch 95, best seen in FIG. 4, which provides a signal when connector 21 is correctly positioned against rod 80 in its termination position. Microcomputer 93 also receives an input signal through line 100 from an analog to digital converter 101 which receives a variable voltage from the linear potentiometer of electrical size selection switch 82.

The preferred microcomputer 93 is a Motorola 68705R3, having three input/output ports, a timer input, two interrupt inputs and four analog to digital inputs.

An oscillator 103 produces a stable output of a 9.5 KHz sine wave with RMS voltage of under 2 volts to a gain control amplifier 104 through line 105. Oscillator 103 is connected to microcomputer 93 by line 106. The oscillator frequency can be controlled by microcomputer 93 through line 106 to compensate for any variation in the performance of oscillator 103 or filter 122 due to manufacturing tolerances in these circuits. Microcomputer 93 controls the coupled signal produced by amplifier 104 by changing the resistance in an operational amplifier feedback loop through a digital to analog converter 107 connected by line 108 to gain control 110. The test signal amplitude is controlled by microcomputer 93 by sampling the amplitude of the test signal at the output of amplifier 104 through a sampling circuit 111 connected to microcomputer 93 through line 112 and analog to digital converter 113. Microcomputer 93 measures amplitude of the test signal of amplifier 104 and adjusts the amplitude to a predetermined level.

The amplified test signal is selectively provided to a step-up transformer 115 by a relay switch 116 controlled by microcomputer 93 through line 117 connected through input/output control 94. Transformer 115 brings the amplitude of the signal to preferred 33 volt RMS. Thus microcomputer 93 can selectively apply a range of amplified oscillatory signals through transformer 115 to signal injection lines 88.

The oscillatory test signal applied to signal emitting bar 47 or 50 and to a signal emitting strip 38 of cable tray 39 by contact 49 or 51 capacitively induces a signal in the conductors of wire harness 31 through the insulation of cable 22. Although applying the test signal to both sides of cable 22 is preferred, the test signal could be injected by a single electrode applied to one side of cable 22.

If the connector 21 is properly terminated the induced test signal is conducted through each cable conductor to each respective contact portion 25 of terminal 24 and into each respective probe contact 67 engaged in contact portion 25 of terminal 24, see FIG. 9. If a conductive path of harness 31 is discontinuous due to such defects as a broken conductor or a missing terminal the test signal will not be conducted through contact portion 25 to probe contacts 67. If a conductive path is faulty due to such a defect as a terminal that only partially pierces the insulation of a wire, a test signal may be induced in contact portion 25 but the test signal will be of substantially reduced amplitude.

The test signal is then conducted by the individual conductors of connector outlet line 91 to bidirectional analog multiplexer 66. Multiplexer 66 is controlled by microcomputer 93 through line 120 to selectively switch between individual conductors of connector outlet line 91 to apply the test signal from one of the 64 conductors of connector outlet line 91 to line 121. Line 121 conducts this signal through a band pass filter 122 to and AC/DC converter 123 to an analog to digital converter 124 and finally to microcomputer 93. Band pass filter 122 is a narrow band biquad filter that removes any spurious signals from the test signal that may be induced in the normal work environment of a harness manufacturing facility. The test signal is converted from an AC signal to a proportionate DC voltage level by AC/DC converter 123 with active signal processing which includes a full wave rectifying stage and a "peak hold" stage. The DC voltage level is then converted to a digital signal by analog to digital converter 124.

Microcomputer 93 is programmed to compare the digital signal received from analog to digital converter 124 to a predetermined range of acceptable reference values indicative of proper termination and of continuity in the harness conductive path being tested and to provide an output signal to an operator display 125 which preferably consists of alphanumeric display indicating whether a particular conductive path is faulty. Microcomputer 93, through multiplexer 66, then sequentially tests each conductive path and stores the condition of each conductive path for later display.

It is possible for a conductive path to be faulty and still induce a test signal of substantially reduced amplitude in terminal 24 which is then conducted to a respective probe contact 67; for example, due to a terminal that only partially pierces the insulation of a wire without torching the conductor of the wire. Preferably, the range of acceptable amplitude values indicative of proper termination and continuity is chosen to exclude any such lower amplitude signals.

The predetermined references values acceptable is indicate continuity in a conductive path vary in proportion to the amplitude of the oscillatory test signal applied to signal emitting bars 47 and 50 and signal emitting strips 38.

The test signal is actively controlled through gain control 110 by microcomputer 93 allowing the microcomputer to be programmed to vary the amplitude of the test signal to an optimum range for different cable and connector combinations.

An additional test capacity for automatic compensation for dissimilar connector/cable harness combinations can be provided by programming microcomputer 93 to increase the amplitude of the test signal applied to harness 31 to a second test signal amplitude and retest harness 31 at the second increased test signal amplitude level when the initial amplitude level test indicates an open circuit fault. Although the above-described circuitry is not sensitive to minor fluctuation in cable dielectric, the use of significantly dissimilar cables or connectors in different harnesses 31 may result in an erroneous test. Programming microcomputer 93 to retest the harness if an open circuit is indicated in an initial test, provides the capability to automatically compensate for different types of cable dielectrics or dielectric thicknesses. Microcomputer 93 can be programmed such that if a first test indicates that a significant percentage of electrical paths are discontinuous, the microcomputer 93 will increase the test signal amplitude until the percentage of indicated discontinuous circuits is reduced to a predetermined percentage of circuits tested or until a predetermined maximum amplitude signal has been tested. The iterative increase in the amplitude of the test signal compensates for thicker cables and other variations. Thus, the test circuitry can automatically effect accurate tests of dissimilar harnesses without adjustment or operator input for dissimilar connector cable combinations.

Microcomputer 93 controls the reciprocal operation of press 30 through input/output control 94 circuit by the application of a control signal applied to line 126 to a ram actuation valve 127.

After completion of the open circuit tests microcomputer .93 switches relay switch 116 off removing the AC test signal from lines 88.

In preferred form the control circuitry of apparatus 20, through microcomputer 93, controls a short circuit testing means through multiplexer 66 for testing adjacent conductors in harness 31 for short circuits by applying a 5 volt DC signal to one half of the non-adjacent conductive paths of harness 31. The remaining conductive paths are then tested for the presence of a DC signal that would evidence a short between adjacent conductive paths of harness 31. Shorted circuits are then displayed on operator display 125.

We claim:

1. Apparatus for testing a wire harness having at least one connector conductively connected by a terminal to a conductor of an insulated wire to form a conductive path, comprising:

connector probe means for conductively engaging and connecting a terminal of a conductive path to be tested to a connector outlet;

test signal means for capacitively inducing an oscillatory test signal in the conductor of a wire of the conductive path to be tested; and electrical continuity test means for measuring the amplitude of the oscillatory test signal at the connector outlet of each conductive path to be tested and comparing the measured amplitude to a predetermined amplitude value and for providing a fault signal indicative of the condition of the conductive path to be tested when the measured amplitude is equal to the predetermined amplitude value;

wherein the electrical continuity test means includes a digital computer connected to the connector outlet, the digital computer is programmed to provide the comparison of the amplitude of the test signal and the provision of the fault signal, the test signal means includes an oscillator and an operational amplifier and the digital computer includes means for controlling the operational amplifier to increase the amplitude of the oscillatory test signal to a second signal amplitude.

2. An apparatus as set forth in claim 1, including band pass filter means for removing any spurious signals from the oscillatory test signal, an alternating current to direct current converter and an analog to digital converter connected in series between the connector outlet and the digital computer.

3. An apparatus as set forth in claim 1, wherein the digital computer is programmed to increase the amplitude of the oscillatory test signal when the measured test signal amplitude is a predetermined lesser magnitude than the amplified oscillatory test signal initially provided by the test signal means and to retest the conductive path by comparing the increased amplitude of the test signal to a second predetermined amplitude value.

4. An apparatus as set forth in claim 3, wherein a multiplexer is connected between the connector outlet and the electrical continuity test means such that individual conductive paths of a multiple conductive path harness can be sequentially tested by the electrical continuity test means.

5. An apparatus as set forth in claim 4, wherein the electrical continuity test means includes short circuit test means for detecting short circuits between adjacent conductive paths.

6. An apparatus as set forth in claim 5, including band pass filter means for removing any spurious signals from the oscillatory test signal, an alternating current to direct current converter and an analog to digital converter connected in series between the connector outlet and the digital computer.

7. An apparatus as set forth in claim 6, wherein the digital computer includes means for selectively controlling the frequency of the oscillator.

8. An apparatus as set forth in claim 1, wherein the test signal means includes a signal emitting plate disposed contiguous to the wire, the connector probe means includes a second connector mateable with the first connector and the outlet includes a plurality of conductors terminated to the second connector.

9. An apparatus as set forth in claim 1, wherein the test signal means includes a signal emitting plate resiliently mounted on a reciprocating ram of a connector termination press in a position to engage the wire of a harness terminated in the press.

10. A method for testing a wire harness having at least one connector conductively connected by a terminal to an insulated wire to form a conductive path, comprising the steps of:
conductively engaging and connecting a terminal of a conductive path to be tested to a connector outlet;
capacitively inducing an oscillatory test signal in the wire of the conductive path to be tested;
measuring the amplitude of the oscillatory test signal at the connector outlet of each conductive path to be tested;
comparing the measured amplitude to a pre-determined amplitude value;
providing a fault signal indicative of the condition of the conductive path to be tested when the measured amplitude is equal to the predetermined amplitude value; and increasing the amplitude of the oscillatory test signal when the measured test signal amplitude is a predetermined lesser magnitude than the original oscillatory test signal and retesting the conductive path by comparing the increased amplitude of the test signal to a second predetermined amplitude value.

11. A method as set forth in claim 10, including the step of sequentially testing multiple conductive paths of a multiple conductor wire harness.

12. A method as set forth in claim 11 including the step of testing the wire harness for short circuits between adjacent conductive paths.

13. An apparatus for terminating a plurality of insulated wires to corresponding terminals of a connector to assembly a wire harness and for testing the assembled wire harness, comprising:
press means for reciprocating a ram mounted on a press frame toward and away from a connector positioning means for termination of a connector disposed in the connector positioning means to a plurality of insulated wires to form a wire harness;
probe means for individually conductively engaging each terminal of the connector after termination of the connector to the insulated wire by the ram;
electrical continuity test means electrically connected to the probe means for testing the wire harness for electrical faults; and
test signal means for emitting an oscillatory test signal generated by an oscillator, with the test signal means disposed at a position spaced from the connector in close proximity to the wires when the ram is in a testing position such that a test signal is capacitively induced in the wires by the test signal means, wherein the electrical continuity test means includes means for measuring the amplitude of the oscillatory test signal induced in each wire and comparing the measured amplitude to a pre-determined amplitude value and for providing a fault signal indicative of the condition of the wire when the measured amplitude is equal to the predetermined amplitude value;
wherein the electrical continuity test means includes a digital computer connected to the probe means, the digital computer is programmed to provide the comparison of the amplitude of the test signal and the provision of the fault signal, the test signal means includes an operational amplifier and the digital computer includes means for controlling the operational amplifier to increase the amplitude of the oscillatory test signal to a second signal amplitude.

14. An apparatus as set forth in claim 13, wherein the test signal means includes an insulated metal bar and biasing means for resiliently biasing the wires and the insulated metal bar into contiguous engagement with the bar electrically connected to the oscillator.

15. An apparatus as set forth in claim 14, wherein the bar is resiliently mounted on the ram and is disposed to press the wires against an insulated metal strip to effect contiguous engagement of the insulation of the wires during testing of the wires between the bar and the strip, and wherein the strip is disposed on a wire positioning tray slidably mounted in the frame of the press and including a spring loaded contact electrically connected to the oscillator for receipt of the test signal therefrom, with the contact disposed to conductively contact the strip when the wire positioning tray is in a wire harness test position such that the test signal applied by the oscillator to the contact is conductively transmitted to the strip.

16. An apparatus as set forth in claim 14, wherein the probe means is carried on the ram of the press and includes a plurality of resilient probe pins each disposed to enter individual apertures of the connector and engage contact portions of the terminals of the connector.

17. An apparatus as set forth in claim 16, including stripping means for resiliently biasing the connector away from the probe pins.

18. An apparatus as set forth in claim 13, wherein the connector positioning means includes centering means for selectively centering connectors of different dimensions with respect to the ram of the press.

19. An apparatus as set forth in claim 18, wherein the centering means includes a positioning rod selectively adjustable by a switch connected to the positioning rod to vary the position of a distal end of the positioning rod with respect to a center line of the ram such that a connector positioned in the connector positioning means abuts the distal end of the positioning rod.

20. An apparatus as set forth in claim 13, including band pass filter means for removing any spurious signals from the oscillatory test signal, an alternating current to direct current converter and an analog to digital converter connected in series between the probe means and the digital computer.

21. An apparatus as set forth in claim 13, wherein the digital computer is programmed to increase the amplitude of the oscillatory test signal when the measured test signal amplitude is a predetermined lesser magnitude than the amplified oscillatory test signal initially provided by the test signal means and to retest the wire by comparing the increased amplitude of the test signal to a second predetermined amplitude value.

22. An apparatus as set forth in claim 21, wherein a multiplexer is connected between the probe means and the electrical continuity test means such that individual wires can be sequentially tested by the electrical continuity test means.

23. An apparatus as set forth in claim 22, wherein the electrical continuity test means includes short circuit test means for detecting short circuits between adjacent wires.

24. An apparatus as set forth in claim 23, including band pass filter means for removing any spurious signals from the oscillatory test signal, an alternating current to direct current converter and an analog to digital converter connected in series between the probe means and the digital computer.

25. An apparatus as set forth in claim 24, wherein the digital computer includes means for selectively controlling the frequency of the oscillator.

26. An apparatus for terminating a plurality of insulated wires to corresponding terminals of a connector to assembly a wire harness and for testing the assembled wire harness, comprising:

press means for reciprocating a ram mounted on a press frame toward and away from a connector positioning means for termination of a connector disposed in the connector positioning means to a plurality of insulated wires to form a wire harness;

test signal means for emitting an oscillatory test signal generated by an oscillator, with the test signal means disposed at a position spaced from the connector in close proximity to the wires when the ram is in a testing position such that a test signal is capacitively induced in the wires by the test signal means;

probe means carried on the ram of the press for individually conductively engaging each terminal of the connector after termination of the connector to the insulated wire by the ram the probe means including a plurality of resilient probe pins each disposed to enter individual apertures of the connector and engage contact portions of the terminals of the connector; and electrically continuity test means electrically connected to the probe means for testing the wire harness for electrical faults, wherein the electrical continuity test means includes means for measuring the amplitude of the oscillatory test signal induced in each wire and comparing the measured amplitude to a pre-determined amplitude value and for providing a fault signal indicative of the condition of the wire when the measured amplitude is equal to the predetermined amplitude value;

wherein the electrical continuity test means includes a digital computer connected to the probe means, the digital computer is programmed to provide the comparison of the amplitude of the test signal and the provision of the fault signal, the test signal means includes an operational amplifier and the digital computer includes means for controlling the operational amplifier to increase the amplitude of the oscillatory test signal to a second signal amplitude.

27. An apparatus as set forth in claim 26, wherein the test signal means includes an insulated metal bar and biasing means for resiliently biasing the wires and the insulated metal bar into contiguous engagement with the bar electrically connected to the oscillator.

28. An apparatus as set forth in claim 27, wherein the bar is resiliently mounted on the ram and is disposed to press the wires against an insulated metal strip to effect contiguous engagement of the insulation of the wires during testing of the wires between the bar and the strip, and wherein the strip is disposed on a wire positioning tray slidably mounted in the frame of the press and including a spring loaded contact electrically connected to the oscillator for receipt of the test signal therefrom, with the contact disposed to conductively contact the strip when the wire positioning tray is in a wire harness test position such that the test signal applied by the oscillator to the contact, is conductively transmitted to the strip.

29. An apparatus as set forth in claim 26, wherein the connector positioning means includes centering means for selectively centering connectors of different dimensions with respect to the ram of the press.

30. An apparatus as set forth in claim 29, wherein the centering means includes a positioning rod selectively adjustable by a switch connected to the positioning rod to vary the position of a distal end of the positioning rod with respect to a center line of the ram such that a connector positioned in the connector positioning means abuts the distal end of the positioning rod.

31. An apparatus as set forth in claim 26, including band pass filter means for removing any spurious signals from the oscillatory test signal, an alternating current to direct current converter and an analog to digital converter connected in series between the probe means and the digital computer.

32. An apparatus as set forth in claim 26, wherein the digital computer is programmed to increase the amplitude of the oscillatory test signal when the measured test signal amplitude is a predetermined lesser magnitude than the amplified oscillatory test signal initially provided by the test signal means and to retest the wire by comparing the increased amplitude of the test signal to a second predetermined amplitude value.

33. An apparatus as set forth in claim 32, wherein a multiplexer is connected between the probe means and the electrical continuity test means such that individual wires can be sequentially tested by the electrical continuity test means.

34. An apparatus as set forth in claim 33, wherein the electrical continuity test means includes short circuit test means for detecting short circuits between adjacent wires.

35. An apparatus as set forth in claim 34, including band pass filter means for removing any spurious signals from the oscillatory test signal, an alternating current to direct current converter and an analog to digital converter connected in series between the probe means and the digital computer.

36. An apparatus as set forth in claim 35, wherein the digital computer includes means for selectively controlling the frequency of the oscillator.

37. An apparatus as set forth in claim 26, including stripping means for resiliently biasing the connector away from the probe pins.

* * * * *